Jan. 5, 1971 D. W. HAGELBARGER ET AL 3,552,004

BATCH FABRICATION OF COMPONENT BOARDS

Filed March 13, 1968 3 Sheets-Sheet 1

INVENTORS D. W. HAGELBARGER
P. S. KUBIK
BY Lucian C Canepa
ATTORNEY

Jan. 5, 1971 D. W. HAGELBARGER ET AL 3,552,004

BATCH FABRICATION OF COMPONENT BOARDS

Filed March 13, 1968

3 Sheets-Sheet 3

3,552,004

BATCH FABRICATION OF COMPONENT BOARDS

David W. Hagelbarger, Morris Township, Morris County, and Peter S. Kubik, South Plainfield, N.J., assignors to Bell Telephone Laboratories, Incorporated, Murray Hill and Berkeley Heights, N.J., a corporation of New York Filed Mar. 13, 1968, Ser. No. 712,741
Int. Cl. H05k *3/00*
U.S. Cl. 29—625 5 Claims

ABSTRACT OF THE DISCLOSURE

Methods for making apertured nonconductive component boards are described. In particular, the methods are directed to forming conductive paths through such boards by batch fabrication techniques according to which a conductive material is readily applied to the insides of the apertures.

BACKGROUND OF THE INVENTION

This invention relates to batch fabrication techniques, and more particularly to improved methods of fabricating nonconductive circuit boards suitable for mounting components.

Nonconductive circuit boards have achieved widespread use in the manufacture of electrical circuitry. Of special significance is the printed circuit board which has facilitated miniaturization and reduced manufacturing costs by eliminating expensive point-to-point hand wiring. In a conventional printed circuit structure the electrical components are positioned on one side of the board and the printed wiring is affixed to the other. Connections are made by routing component leads to the printed wiring through holes in the board. The technique is one well known to those skilled in the art and is disclosed, for example, by R. P. Witt et al. Pat. 2,869,977, issued Dec. 16, 1958.

In the interest of miniaturization and convenience, electrical circuitry is sometimes designed which requires the positioning of components on both sides of a nonconductive board. In such a case it frequently becomes necessary to construct conductive paths through the board in order to connect selected portions of the printed wiring appearing on both sides of the board. A common technique is to drill small-diameter holes in the board and to plate the resultant walls with a suitable conductive material thereby to form conductive through-holes. This method of forming conductive paths through a circuit board is characterized by a number of disadvantages. In the first place, it is often difficult to plate the insides of the small holes drilled in the board, which typically have an inside diameter of 0.02 inch. Secondly, it is ncessary to drill the holes in each individual board, thereby increasing large-scale manufacturing costs.

Nonconductive boards have proven to be particularly useful in efforts to minimize the physical size of large-capacity data processing apparatus. For example, one technique that suggests itself for use in fabricating magnetic core memories is to embed many individual cores in a nonconductive board. In order to eliminate the tedious and costly task of hand wiring turns on these cores, holes are drilled through the board within the center aperture of each core and around its outer periphery. The walls of the resultant holes are plated, thereby forming conductive paths through the board and through and around each core. Conventional printed circuit techniques are then used to plate selected areas of both sides of the board with a suitable conducting substance. In particular, the plated-through holes associated with each core are selectively interconnected by printed wiring, thereby forming the desired windings on each core. Unfortunately this method possesses the same disadvantages noted earlier: the necessity of drilling each board and the difficulty associated with plating the insides of small holes.

Accordingly, it is an object of the present invention to provide an improved method of fabricating nonconductive circuit boards.

More specifically, an object of this invention is to provide an improved method for forming conductive paths through printed circuit boards.

SUMMARY OF THE INVENTION

These and other objects are realized by the present invention which provides a batch fabrication technique for forming conductive paths through printed circuit boards. More specifically, the novel process herein described utilizes a single master mold for the fabrication of many printed circuit structures containing through-conductive paths. Holes are drilled in the master. These holes correspond to the conductive paths that are to extend through the board. A suitable flexible mold-making material is poured over the master, thereby forming a high strength and tear resistant all-rubber mold. After the mold is separated from the master, the mold is coated with a suitable conducting material and plated with copper. The resultant copper-plate structure includes hollow copper pins protruding in areas which correspond to the location of original holes in the master. A suitable encapsulating material such as an epoxy plastic is then poured onto the structure and allowed to harden. The free surface of the epoxy is then ground down to expose the pins, which are then available for use as through-conductive paths.

In an alternative method carried out in accordance with the principles of the present invention, only the protruding pins of the rubber mold are initially coated with a suitable conducting material (such as a silver powder). Then epoxy is poured onto the mold to form a nonconductive board which has conductively-coated holes therethrough. Subsequently the entire board is plated with copper in a one-step operation. In that step the copper deposits readily on the insides of the holes due to the presence therein of the previously-applied conductive coating.

A feature of the novel processes herein described is the utilization of the outsides of molded pins rather than the insides of small holes as the basis for forming conductive paths through printed circuit structures.

A further feature of the present invention is the use of a master mold drilled with a single set of holes to fabricate a number of printed circuit substrates with through-conductive paths.

A complete understanding of the present invention and of the above and other objects, features and advantages thereof may be gained from a consideration of the following detailed description and the accompanying drawing.

DETAILED DESCRIPTION

Figure 3:
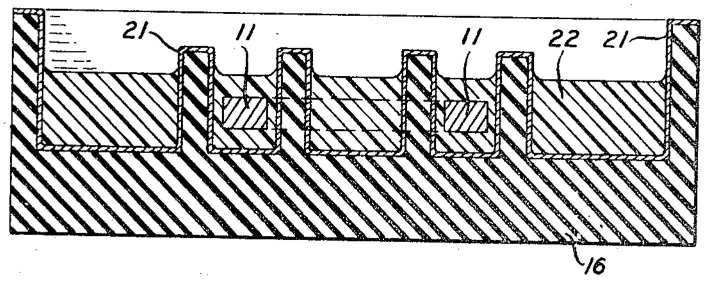
FIG. 3 is a side view of the copper-plated rubber mold shown in FIG. 2 after a magnetic core has been embedded in the poured epoxy.
Figure 4:
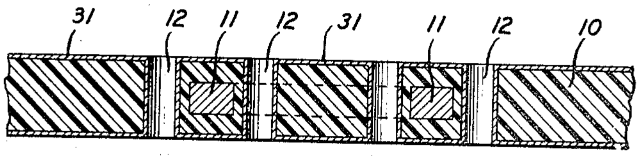
FIG. 4 shows a sectional view of the completed board.
Figure 5:
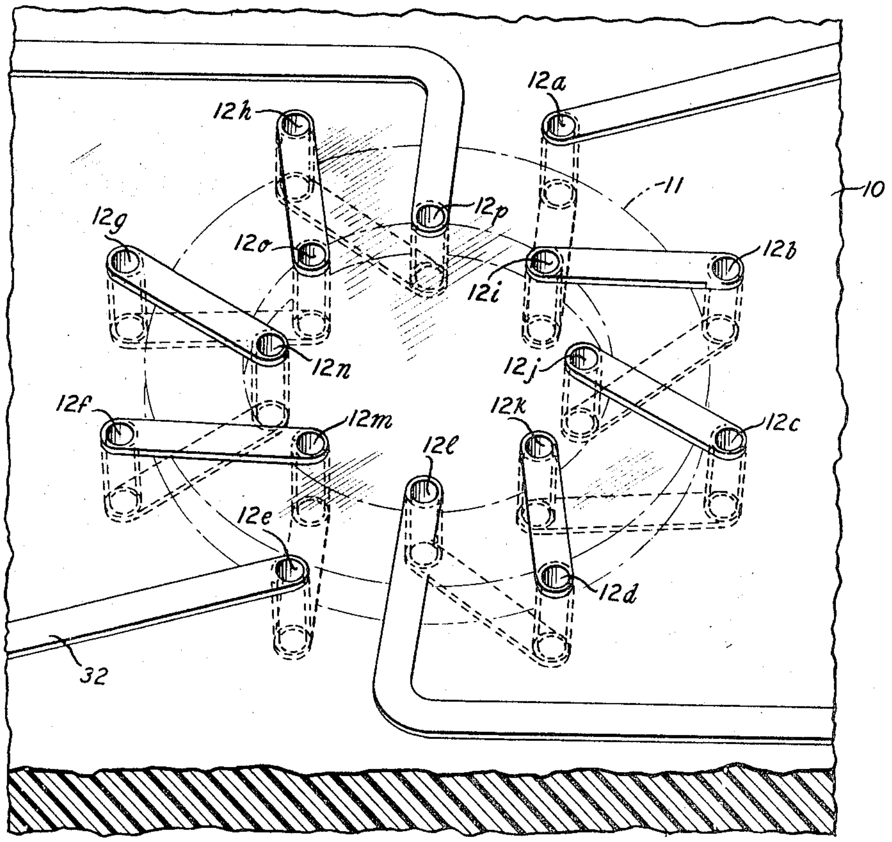
FIG. 5 shows a particular manner of interconnecting the sixteen conductive through holes appearing in the completed board in order to form two four-turn windings about the embedded core.

FIGS. 3 through 5 of the drawing depict an illustrative printed circuit structure made in accordance with the principles of one of the novel processes herein described. More specifically, these figures and the accompanying description disclose a structure made by a batch fabrication technique for constructing conductive paths through printed circuit boards which contain embedded magnetic cores.

In order to minimize the amount of current and power required to drive a conventional magnetic core memory, as well as to reduce its physical size, ferrite cores are ued which are as small as can be conveniently handled. The practice of embedding the cores in a nonconductive board has proved to be a convenient method of mounting these tiny components since many can thereby be contained in a single board. Unfortunately, the embedding technique makes it difficult to place the desired windings about the cores. An early prior art solution was to drill holes around the outside and through the center of each core; windings were then hand wired through these holes in the board. This technique quickly revealed itself to be tedious and prohibitively expensive. As a result the technique of plating holes to form through-conductive paths was developed as an alternative method of constructing the required windings. As mentioned earlier, however, even this process proved deficient since holes had to be drilled in each board and, once drilled, the holes were difficult to plate.

Any process for fabricating conductive paths through printed circuit boards requires the initial step of selecting the location of the various paths. For the sake of simplicity the illustrative structure to be described herein, partially depicted in FIG. 4, comprises a single printed circuit board 10, a single embedded ferrite core 11 and sixteen conductive-through holes 12 (only four of which are actually shown in FIG. 4). The sixteen holes, which are used to provide two four-turn windings about core 11, in the manner shown in FIG. 5, are spaced along two substantially concentric circles such that eight (designated 12_a_ through 12_h_) are located uniformly about the outer periphery of core 11 while eight (designated 12_i_ through 12_p_) are located at uniform intervals about the inner periphery.

Figure 1A:
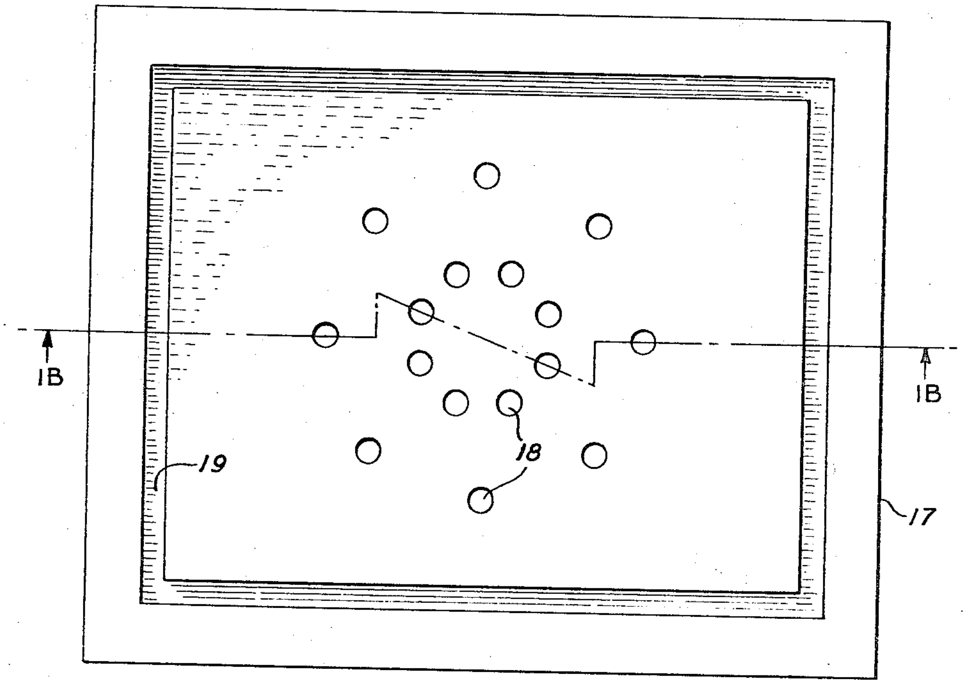
FIGS. 1A and 1B show top and side views, respectively, of a master mold suitable for fabricating nonconductive boards in accordance with the principles of the present invention.
Figure 1B:
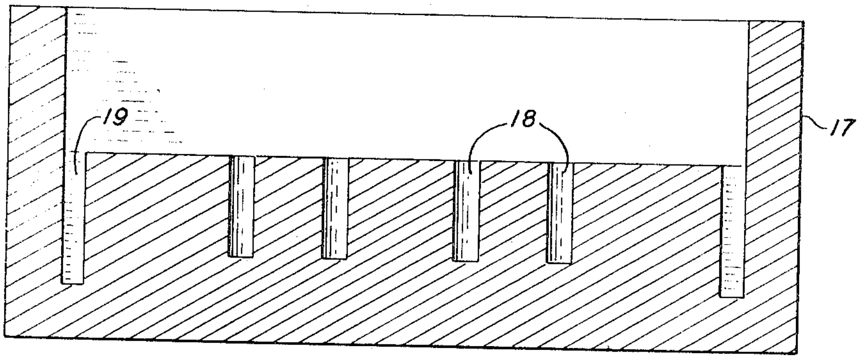

Once the geometric configuration of the board and the conductive paths have been selected, a master mold 17 (FIGS. 1A and 1B) is constructed. Typically this mold is fabricated out of stock brass by methods well known to those skilled in the art. Sixteen holes 18 are drilled in mold 17 which correspond to the exact location of desired conductive paths. Additionally, four interconnected channels designated 19 are constructed which will eventually provide retaining walls for the uncured nonconductive material utilized in fabricating the board. It is to be noted that the only holes that need be drilled throughout the novel process herein disclosed are the holes 18 in master mold 17. This is true regardless of the number of boards to be fabricated.

Figure 2A:
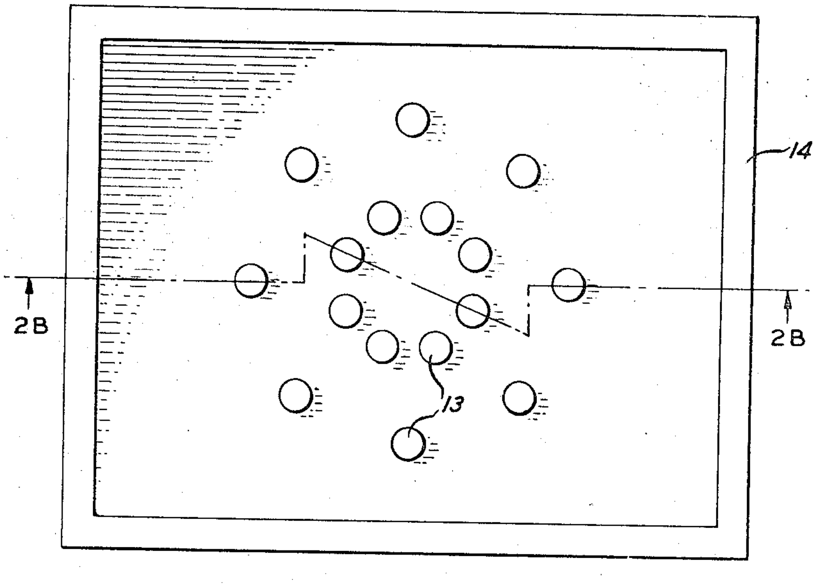
FIGS. 2A and 2B show top and side views, respectively, of a copper-plated rubber mold made from the master mold depicted in FIG. 1.

After the master mold 17 has been constructed, a mold-making material, such as, for example, RTV silicon rubber, is poured onto its contoured surface. This well-known rubber material exhibits high strength and is tear resistant, and upon curing can be easily separated from mold 17 thereby forming rubber mold 16 illustrated in FIGS. 2A and 2B. As is apparent from FIGS. 2A and 2B, mold 16 includes four retaining walls 14 and sixteen protruding posts or pins 13 formed from the aforementioned holes 18.

Although nonflexile mold-making materials may be employed in carrying out the unique methods described herein, it is noted that the use of flexible materials therefor is advantageous. As will be apparent from the description below, a flexible mold-making material facilitates the fabrication of nonconductive boards having relatively long small-diameter holes.

Once rubber mold 16 is fabricated, its entire surface is then plated with a suitable conducting material. Since mold 16 is a nonconductor the preliminary step of coating its surface with a conducting medium is necessary. Illustratively, this is easily accomplished by dusting mold 16 with silver powder. The silver powder naturally adheres to rubber mold 16 and any excess can be easily washed away with water. Mold 16 then is plated with copper by methods well known to those skilled in the art. Typically the plating, designated 21 in FIG. 2B, is approximately .002 inch in thickness.

It is to be noted that the above-mentioned plating step eliminates one of the disadvantages associated with prior art techniques of fabricating through-conductive paths. As pointed out earlier these paths are conventionally formed by coating the insides of small holes, a process that is difficult and frequently unsatisfactory in terms of the uniformity of the resultant plating. The method of the present invention, however, does away with the conventional step of plating the insides of nonconductive holes. Rather the outsides of pins 13 are plated, a technique that is at once convenient and effective.

Figure 2B:
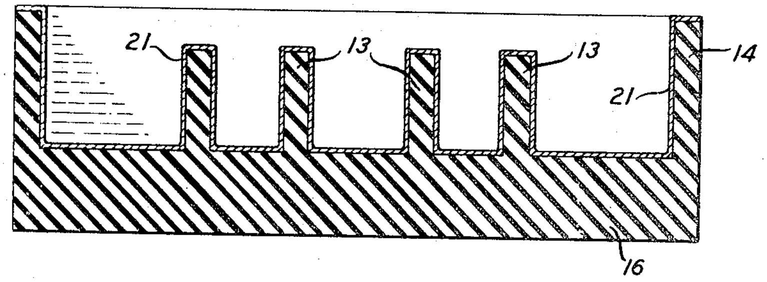

The structure shown in FIG. 2B, comprised of mold 16 and plating 21, is ready for final processing. Illustratively, a ferrite toroid suitable for use as a magnetic core memory element is positioned on plating 21 such that the toroid lies in the circular channel formed by the two concentric circles of copper-plated pins 13. The exact location of core 11 within this channel is not critical; indeed it matters not that the core comes in contact with one or more of the pins since the core itself is a nonconductor.

Referring now to FIG. 3, with the core in position sufficient epoxy plastic (22 or any other suitable encapsulating material) is poured into the copper-plated mold to cover the core yet leaves the tips of pins 13 exposed. Using well-known and conventional methods the epoxy is poured under a vacuum in order to remove trapped air. It has been found that advantageous results are obtained by the use of epoxy which contains fine particles of sand dispersed throughout. The particles in such a so-called "filled epoxy" material prevent core 11 from coming in direct contact with plating 21, thereby truly embedding the core in the epoxy. More specifically, it has been found that the filled epoxy flows under core 11 when the entire assembly is subjected to the vacuum, hence making it unnecessary to pour a small amount of epoxy into mold 16 before placement of the core thereon.

After epoxy has been allowed to cure, mold 16 can be easily separated from the structure comprised of plating 21, core 11 and epoxy 22. The process of separation is facilitated by two factors: (1) the presence of the aforementioned silver powder which advantageously acts as a mold release and (2) the fact that the flexible rubber mold possesses high tear strength and is capable of high elongation. It is to be noted that mold 16 is now available for the fabrication of additional boards with through-conductive holes, each of which can be constructed without the necessity of drilling holes and plating their inner walls.

It is noted that the above-specified plating of the mold 16 contributes significantly to prolonging the life of the mold. This advantageous result stems from the fact that the plating serves to protect the mold from chemical attack by the epoxy encapsulating material.

Once separation from mold 16 has been completed, the free or pouring surface of the epoxy, as well as the tips of the exposed pins are machined smooth. This surface is then copper plated in accordance with conventional procedures. The resulting structure is depicted in a cross-sectional view in FIG. 4. Inspection of this drawing reveals that the board is now copper clad on both sides and contains copper-plated conductive holes, the plating being designated 31. All that remains to be done is to etch (or otherwise selectively remove material from) the board, using techniques well known to those skilled in the art of printed circuitry, in order to complete the desired windings. A pattern of conductive lines 32, suitable for forming two four-turn windings about core 11 out of the sixteen conductive holes 12, is shown in FIG. 5.

The principles of the present invention described above can be carried out by an alternative procedure. The initial steps are identical to those described above, namely construction of master mold 17 and rubber mold 16. Once these elements are separated from each other, silver powder is applied to rubber pins 13. A core is dropped in position between the two concentric circles of pins and epoxy is poured over the structure under a vacuum. Once the epoxy dries the rubber mold can be removed. Due to the adhesive nature of epoxy, substantially all the silver powder that was initially on the outsides of the rubber pins will now be located on the inner walls of the holes in the board. The entire board can then be ground flat and subsequently plated with copper. Copper plating will be readily deposited on the insides of the holes due to the uniform coating of silver powder previously deposited therein. As a consequence, this alternative procedure also eliminates the disadvantages of prior art schemes since holes need only be drilled in the master mold and the holes in the board can be effectively and easily plated. The resultant copper-clad structure can then be etched or otherwise selectively configured in the manner depicted in FIG. 5 in order to complete the desired windings.

It is to be understood that the above-described methods are only illustrative to the application of the principles of the present invention. In accordance with these principles, numerous other methods may be devised by those skilled in the art without departing from the spirit and scope of the invention. For example, it is noted that although emphasis herein has been directed to the fabrication of a magnetic core structure, the novel techniques disclosed herein are applicable to the formation of conductive holes through a nonconductive board adapted to have associated therewith a variety of surface-mounted and/or encapsulated components.

We claim:

1. A method for fabricating nonconductive circuit boards containing through-conductive paths, comprising the steps of:

forming a mold which comprises a base portion and a plurality of projecting portions corresponding to said through-conductive paths, coating said projecting portions with an electrical conductor, filling said mold with sufficient insulative material to embed said coated projecting portions, and non-destructively separating said mold from said insulative material, thereby to form an insulative structure with embedded conductive paths.

2. A method as in claim 1 further including the steps of removing sufficient insulative material to expose the ends of said conductive paths, and coating said insulative structure with an electrical conductor.

3. A method as in claim 2 wherein said mold is cast from a master mold configured to form said projecting portions.

4. A method for fabricating nonconductive circuit boards containing through-conductive paths, comprising the steps of:

forming a mold which comprises a base portion and a plurality of projecting portions corresponding to said through-conductive paths, coating said mold with an electrical conductor, adhering sufficient insulative material to said coated mold so as to form a unitary structure comprising an insulative board conductively coated on one side and containing through-conductive paths, non-destructively separating said mold from said board, removing sufficient insulative material from the uncoated surface of said board to expose the ends of said conductive paths, and coating said uncoated surface with an electrical conductor.

5. A method as in claim 4 wherein said mold is made of a flexible material cast from a master mold configured to form said projecting portions.

References Cited

UNITED STATES PATENTS

| | | | |
|---|---|---|---|
| 2,955,351 | 10/1960 | McCreadie | 29—625 |
| 3,017,614 | 1/1962 | Rajchman | 340—174 |
| 3,077,658 | 2/1963 | Wharton | 29—625X |
| 3,079,672 | 3/1963 | Bain et al. | 29—625 |
| 3,085,295 | 4/1963 | Pizzino et al. | 264—255 |
| 3,209,066 | 9/1965 | Toomey et al. | 156—150X |
| 3,325,881 | 6/1967 | Engelking | 29—625 |

JOHN F. CAMPBELL, Primary Examiner

C. E. HALL, Assistant Examiner

U.S. Cl. X.R.

29—423, 604; 156—150; 174—68.5; 264—255, 272, 313